(12) United States Patent
Ramian et al.

(10) Patent No.: US 11,619,920 B2
(45) Date of Patent: Apr. 4, 2023

(54) METHOD OF CUSTOMIZED SETTING AS WELL AS MEASUREMENT SYSTEM

(71) Applicant: Rohde & Schwarz GmbH & Co. KG, Munich (DE)

(72) Inventors: Florian Ramian, Munich (DE); Florian Lang, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 566 days.

(21) Appl. No.: 16/374,592

(22) Filed: Apr. 3, 2019

(65) Prior Publication Data

US 2020/0319615 A1 Oct. 8, 2020

(51) Int. Cl.
*G05B 19/042* (2006.01)
*G01R 35/00* (2006.01)
*G06F 8/40* (2018.01)
*G06F 8/51* (2018.01)

(52) U.S. Cl.
CPC ....... *G05B 19/0426* (2013.01); *G01R 35/002* (2013.01); *G06F 8/40* (2013.01); *G06F 8/51* (2013.01); *G05B 2219/23039* (2013.01)

(58) Field of Classification Search
CPC ...... G05B 19/0426; G05B 2219/23039; G06F 8/40; G06F 8/51; G01R 35/002
See application file for complete search history.

(56) References Cited

U.S. PATENT DOCUMENTS

| | | | |
|---|---|---|---|
| 6,952,655 B2 | 10/2005 | Cake et al. | |
| 7,024,660 B2 | 4/2006 | Andrade et al. | |
| 7,152,027 B2 | 12/2006 | Andrade et al. | |
| 7,272,524 B2* | 9/2007 | Brogardh | G05B 19/4207 901/50 |
| 7,290,244 B2 | 10/2007 | Peck et al. | |
| RE41,228 E * | 4/2010 | Kodosky | G06F 30/30 715/771 |
| 2003/0192032 A1* | 10/2003 | Andrade | G06F 11/273 717/124 |
| 2003/0233633 A1* | 12/2003 | Steinrisser | G01G 11/086 717/109 |
| 2004/0216139 A1 | 10/2004 | Rhoda et al. | |
| 2005/0177816 A1* | 8/2005 | Kudukoli | G06F 8/34 717/105 |
| 2009/0240351 A1* | 9/2009 | Leong | G06F 8/35 700/86 |
| 2009/0254878 A1* | 10/2009 | Sage | G06F 8/656 717/106 |
| 2012/0197572 A1 | 8/2012 | Braunstorfinger et al. | |

(Continued)

*Primary Examiner* — Wei Y Zhen
*Assistant Examiner* — Amir Soltanzadeh
(74) *Attorney, Agent, or Firm* — Christensen O'Connor Johnson Kindness PLLC

(57) ABSTRACT

A method of customized setting at least one measurement device, comprises the steps of setting an intended measurement setup on the at least one measurement device manually via a user interface, recording, via a command recorder, at least one remote control command assigned to the manual setting of the intended measurement setup, converting the at least one remote control command recorded into specific instructions, and generating a standalone executable code at least based on the specific instructions obtained from the remote control command recorded. Further, a measurement system is provided.

19 Claims, 1 Drawing Sheet

(56) References Cited

U.S. PATENT DOCUMENTS

2015/0339127 A1* 11/2015 Lee .................... G06F 9/44505
713/1
2020/0310373 A1* 10/2020 Ganesan ............. G05B 19/042

* cited by examiner

METHOD OF CUSTOMIZED SETTING AS WELL AS MEASUREMENT SYSTEM

FIELD OF THE DISCLOSURE

Embodiments of the present disclosure relate generally to a method of customized setting at least one measurement device. Further, embodiments of the present disclosure relate generally to a measurement system for performing customized measurements.

BACKGROUND

In modern measurement systems, several measurement devices or rather measurement instruments may be used to perform certain measurements on a device under test. Due to constraints assigned to the measurement setup, the user of the measurement system may not have direct access to the respective measurement device such that the user has to control the measurement device in a remote manner.

Hence, the user has to generate a script or rather a program in order to be enabled to control the measurement device in a remote manner in order to perform the intended measurement. However, the customers typically have limited or no experience in programming.

So far, the user typically tries to identify a certain code that may be usable for the specific task the user has to fulfill. Then, the user modifies the code identified according to his specific needs in order to be enabled to generate the script or rather program needed for remotely controlling the measurement device. However, typical occurring obstacles relate to synchronizing commands and reading out of results.

Accordingly, there is a need for a simpler way to control a measurement device in a desired manner.

SUMMARY

Embodiments of the present disclosure provide a method of customized setting at least one measurement device. In an embodiment, the method comprises the following steps:

setting an intended measurement setup on the at least one measurement device manually via a user interface;

recording, via a command recorder, at least one remote control command assigned to the manual setting of the intended measurement setup;

converting the at least one remote control command recorded into specific instructions; and generating a standalone executable code at least based on the specific instructions obtained from the remote control command recorded.

Further, embodiments of the present disclosure provide a measurement system for performing customized measurements. In an embodiment, the measurement system comprises:

at least one measurement device;

a user interface via which a user of the measurement system is enabled to manually set an intended measurement setup of the at least one measurement device;

at least one command recorder assigned to the at least one measurement device, the command recorder being configured to record at least one remote control command assigned to the manual setting of the intended measurement setup;

a conversion module configured to convert the at least one remote control command into specific instructions; and a code generation module configured to generate a standalone executable code at least based on the specific instructions obtained.

Accordingly, a method as well as a measurement system are provided that ensure to generate a standalone executable code in a simplified manner by converting a manual configuration of the measurement device into the standalone executable code such that a user-defined executable code, for instance an application, can be created in a simple manner. The user-defined executable code may extend the functionality of the respective measurement device, as it relates to a certain measurement setup.

In other words, the method as well as the measurement system ensure that settings made on the measurement device are transferred into the standalone executable code that may run on the measurement device itself. Put another way, user interface settings are transferred into the standalone executable code by the system or rather the method.

In general, the user interface may relate to a graphical user interface via which the user may interact with the respective measurement device. For instance, the graphical user interface is provided by the measurement device itself or rather a separate processing unit that is connected with the measurement device.

Put another way, the measurement system is adapted to understand or rather learn the manual setting done by the user of the measurement system. In addition, the measurement system is configured to convert the manual setting into a standalone executable code that can be executed by the measurement system.

Thus, the user does not have to program the respective executable code by itself entirely, as the respective programming is done by the measurement system itself while converting the at least one remote control command recorded into specific instructions that are used to generate the standalone executable code.

In some embodiments, the conversion relates to assigning the commands with right instructions. Generally, the remote control command may relate to a print command, a write command, a read command and other typical commands. The commands themselves may relate in some embodiments to measuring or setting a parameter.

In some embodiments, the intended measurement setup relates to the settings of the measurement device, which are applied in order to put the measurement device into condition for performing the respective measurements.

The command recorder in some embodiments may be assigned to a simple generation of a remote-control sequence for at least one measuring device.

For this purpose, the command recorder may compare all adjustable parameters of the respective measuring device with parameters for a basic setting of the measuring device at a given time in order to generate control commands for the deviating parameters, with which these can be adjusted. The comparison with the parameters of a basic setting is particularly advantageous because, in most cases, only very few of the adjustable parameters are changed, so that the required memory space for the control commands is reduced if these are provided only for the deviating parameters. Moreover, the generation of these control commands is accomplished very quickly and precisely by the command recorder because all of the adjusted parameters for the measuring device need not be buffered.

In some embodiments, the at least one measurement device may relate to a signal generator, a spectrum analyzer, a network analyzer or an oscilloscope.

According to an aspect, the standalone executable code is generated automatically. Thus, it is not required that the user of the measurement system has skills in programming, as the standalone executable code is generated in an automatic manner based on the manual setup of the respective measurement device.

Another aspect provides that the manual setting of the intended measurement setup is converted automatically into the standalone executable code. The steps of recording the remote control command, converting the remote control command into instructions and generating the code based on the instructions are performed automatically without any manual interaction.

According to another aspect, the specific instructions are integrated into an already existing code when generating the standalone executable code. The already existing code may relate to a demo code that is assigned to a basic framework of the standalone executable code. Hence, the specific instructions obtained from converting the at least one remote control command are used to fill up the already existing code. Again, the integration may also be done in an automatic manner such that no manual interaction is required.

For instance, the at least one remote control command is a so-called SCPI command. Thus, a command recorder records a SCPI command. The respective SCPI command recorded is converted into instructions by the conversion module.

In some embodiments, the at least one remote control command recorded may be read out from the command recorder, wherein an automatic framing is applied on the at least one remote control command recorded in order to obtain the specific instructions. Accordingly, the conversion module is configured to read out from the command recorder the at least one remote control command recorded. The framing is done by the conversion module. Hence, the conversion module may be configured to apply a framing on the at least one remote command recorded. Thus, a separate toolkit may be provided that reads out the remote control command recorded by the command recorder on user request wherein the necessary framing is applied on the at least one remote control command recorded. This means that specific programming language may be taken into account in order to obtain the specific instructions, as these specific instructions have to relate to the specific programming language used, for instance by the operating system of the measurement device.

Hence, the SCPI command recorded may be converted into specific instructions depending on the specific programming language to be used by the standalone executable code that shall be generated. In some embodiments, the programming language may be set by the measurement device or rather the measurement system processing or rather executing the standalone executable code later.

Moreover, additional instructions may be taken into account that are provided by the user. In other words, other code selected or created by the user is taken into account. Hence, the user is allowed to add own code or procedures that are processed by the measurement system such that the standalone executable code encompasses the additional instructions. In other words, a user having skills in programming is enabled to add individual instructions in the respective programming language.

Hence, the additional instructions provided in a manual manner as well as the instructions derived automatically may be combined into the standalone executable code.

In some embodiments, the (optional additional) instructions are compiled in an appropriate manner. Further, the necessary dynamic link libraries and libraries are added, which are needed by the specific programming language, namely the one used by the operating system of the measurement device.

Another aspect provides that the standalone executable code is loaded into the at least one measurement device. Hence, the standalone executable code may be provided by the at least one measurement device. The measurement device may execute the standalone executable code by itself. Accordingly, an external processing unit such as a computer is not required in order to generate and execute the standalone executable code.

In some embodiments, the standalone executable code may be executed on at least one of a separate processing unit assigned to the at least one measurement device or the at least one measurement device itself. The separate processing unit may be a computer that is assigned to the measurement system, for example the at least one measurement device. In other words, the computer may be used to control the measurement device.

Generally, the standalone executable code may relate to a remote script, an application, a procedure or a program. For instance, an auto-level, a data-converter and/or an own-build decoder may be provided by the standalone executable code. The standalone executable code may call functions of the firmware.

Another aspect provides that the at least one measurement device is a remotely controlled measurement device. Hence, the user of the measurement system may not have direct physical access to the measurement device under real operation conditions of the measurement device. For controlling the measurement device, a separate processing unit may be included, such as a computer.

Further, the user may have at least one of remote access and physical access to the at least one measurement device via the user interface. The physical access may be provided when manually setting the intended measurement setup. However, under typical operation of the measurement device, the measurement device may be controlled in a remote manner.

According to another aspect, the command recorder is a remote command recorder that is queried by entering an assigned IP address. Hence, the user of the measurement system may access the remote command recorder by entering its IP address.

Further, the remote command recorder may provide specified path information about the at least one remote control command recorded, namely the SCPI recordings, for user selection. Thus, the user can access the remote control commands recorded and (optionally) select the desired ones, as the respective path information is provided.

According to another aspect, the standalone executable code may be provided to the user via the user interface, via which the user is enabled to directly execute the standalone executable code. Hence, the user may execute the standalone executable code generated via the user interface. For this purpose, the standalone executable code has been uploaded to the respective measurement device previously.

An aspect provides that at least one of the conversion module and the code generation module corresponds to a software module. In some embodiments, the software module corresponds to a plugin, for instance for the measurement device or rather the separate processing unit interacting with the measurement device in a remote manner. Thus, the respective plugin may be installed such that it is applied on the recorded remote control command. In some embodiments, the plugin may relate to a plugin for a software development kit (SDK) or an integrated development environment (IDE).

In some embodiments, the standalone executable code generated may be started based on an event, remotely and/or directly, for instance by pushing a button or area on an interface.

In some embodiments, the measurement system may relate to a single device with a housing that encompasses all components of the measurement system.

In some embodiments, the at least one remote control command relates to a control command issued on a separate device and/or a control command issued at the measurement device itself.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
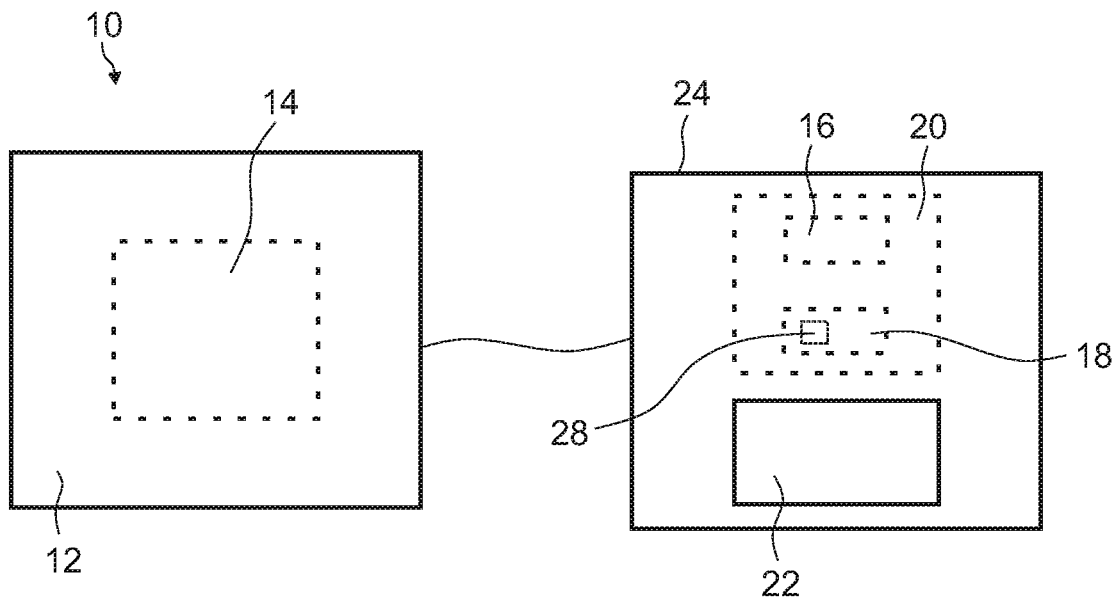
FIG. 1 schematically shows a representative embodiment of a measurement system according to the present disclosure.

FIG. 1 shows a representative embodiment of a measurement system 10 for performing customized measurements. As shown in FIG. 1, the measurement system 10 comprises at least one remotely controlled measurement device 12 that is assigned to at least one command recorder 14. In the shown embodiment, the command recorder 14 is integrated in the measurement device 12 that is also called measurement instrument.

The measurement system 10 shown in the embodiment of FIG. 1 also has a conversion module 16 as well as a code generation module 18. In some embodiments, the conversion module 16 as well as the code generation module 18 both may be assigned to a common processing module 20 that relates to a software module such as a toolkit or rather a plugin.

The measurement system 10 also includes a user interface 22 that may be established by a graphical user interface. Via the user interface 22, the user of the measurement system 10 is enabled to manually set an intended measurement setup of the at least one measurement device 12.

In the shown embodiment, the common processing module 20, encompassing conversion module 16 and the code generation module 18, as well as the user interface 22 are assigned to another processing unit 24 that is established separately from the measurement device 12, for instance a computer.

Figure 2:
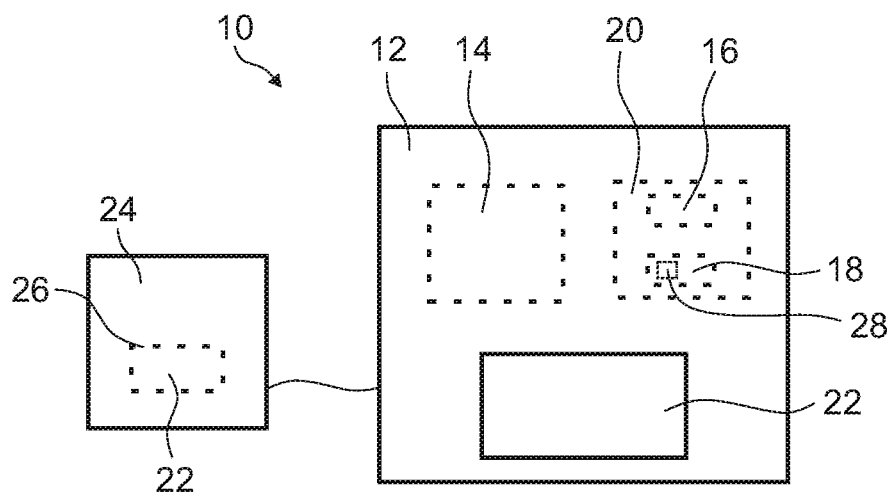
FIG. 2 schematically shows another representative embodiment measurement system according to the present disclosure.

Alternatively, the common processing module 20 encompassing conversion module 16 and the code generation module 18 may relate to a plugin that is assigned to the measurement device 12, as shown in FIG. 2.

Hence, the conversion module 16 and the code generation module 18 are loaded or rather installed on the measurement device 12. Hence, the common processing module 20 runs together with an operating system of the measurement device 12.

However, the measurement device 12 may be controlled in a remote manner by the other processing unit 24. The processing unit 24 may have the user interface 22 at least partly via which the user is enabled to control the measurement device 12 remotely. Alternatively, another user interface 26 is provided that is solely assigned to the other processing unit 24.

In general, the at least one user interface 22 may relate to a remote user interface or rather a local user interface such as the graphical user interface.

Hereinafter, a method of customizing the setting of the at least one measurement device 12 is described with reference to FIG. 3. The measurement system 10, components thereof or associated therewith, etc., is configured to perform the steps schematically shown in FIG. 3 in order to customize the settings of the at least one measurement device.

Figure 3:
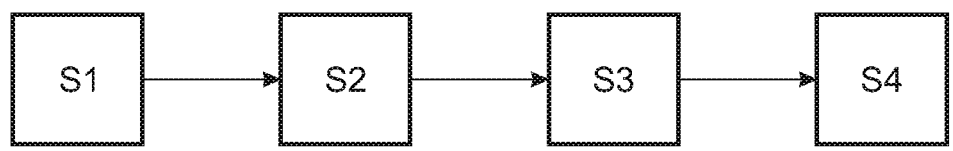
FIG. 3 shows a flow-chart of a representative method of customized setting at least one measurement device according to the present disclosure.

In some embodiments, one or more computer-readable storage media is provided containing computer readable instructions embodied thereon that, when executed by one or more computing devices (contained in or associated with the measurement device 12, command recorder 14, conversion module 16, code generation module 18, common processing module 20, user interface 22, other processing unit 24, and/or other user interface 26 etc.), cause the one or more computing devices to perform one or more steps of the method of FIG. 3 described below. In other embodiments, one or more of these method steps can be implemented in digital and/or analog circuitry or the like.

In a first step S1, an intended measurement setup is set on the at least one measurement device 12 manually, namely via the user interface 22 that can be a local one assigned to the measurement device 12 itself or rather a remote one assigned to the separately formed processing unit 24.

In a second step S2, at least one remote control command is recorded via the command recorder 14 that is assigned to the measurement device 12. The remote control command is assigned to the manual setting of the intended measurement setup that is done via the user interface 22. Accordingly, the command recorder 14 detects the respective (manual) settings of the measurement device 12 done by the user, for example the respective configuration. In some embodiments, the at least one remote control command recorded may relate to a so-called SCPI command.

In a third step S3, the at least one remote control command recorded, namely the SCPI command, is converted into specific instructions by the conversion module 16. Therefore, the conversion module 16 may interact with the command recorder 14 in order to read out the at least one remote control command recorded.

The specific instructions obtained after the conversion depend on the specific programming language used by the measurement device 12 or rather the other processing unit 24, for example the respective operating system that is used for executing the instructions.

Generally, the at least one remote control command recorded is read out from the command recorder 14 by the conversion module 16. In some embodiments, the conversion module 16 applies an automatic framing on the at least one remote control command recorded in order to convert the respective command, namely the SCPI command, into instructions with the specific programming language that has to be used by the standalone executable code due to the respective operating system that shall execute the standalone executable code.

In a fourth step S4, a standalone executable code is generated by the code generation module 18 based on the specific instructions obtained from the conversion module 16 by converting the remote control command recorded previously, namely the SCPI command. Hence, the code generation module 18 generates the specific standalone executable code that is assigned to the remote script, the application, the procedure or rather the program that runs on the measurement device 12 or rather the other processing unit 24.

Generally, steps S2 to S4 are performed automatically such that the standalone executable code is generated in an automatic manner.

In some embodiments, the manual setting of the intended measurement setup (configuration of the measurement device 12) that has been done in step S1 is converted automatically into the standalone executable code that is generated in step S4 while the manual setting is recorded by the command recorder 14 and converted via the conversion module 16 into a specific programming language in an automatic manner.

Hence, the user of the measurement system 10 does not necessary have to have programming skills for obtaining a standalone executable code used for remote controlling of the measurement device 12.

The code generation module 18 may comprise a storage medium 28 in which an already existing code is stored, namely a demo code. The specific instructions obtained by the conversion module 16 are integrated into the already existing code when generating the standalone the executable code. As mentioned, the already existing code may relate to a demo code or a framework that is filled by the specific instructions in order to obtain the standalone executable code, for instance the program that can be executed directly.

For executing the standalone executable code that was obtained by the code generation module 18, the respective code can be loaded into the at least one measurement device 12 such that the code is executed by the measurement device 12 itself. Alternatively, the code is executed on the at least one separate processing unit 24 that is assigned to the measurement device 12.

Generally, the standalone executable code may be provided to the user via the user interface 22, namely the local one or the remote one, such that the user is enabled to directly execute the standalone executable code. Accordingly, the user interface 22 may be provided at the at least one measurement device 12 directly as shown in FIG. 2 provided that the executable code is loaded into the at least one measurement device 12. Alternatively, the user interface 22 may be established in a separate manner as shown in FIG. 1.

In embodiments of step S1, the user may have remote access to the measurement device 12, for instance via the separate processing unit 24, or direct physical access, for example via the local user interface 22, in order to set the intended measurement setup on at the at least one measurement device 12.

The command recorder 14 detects the manual setting appropriately in order to record the respective remote control command(s) assigned to the manual settings of the measurement device 12.

The command recorder 14 may be a remote command recorder that is queried by entering an assigned IP address in order to obtain access to the remote control command(s) recorded. Hence, the remote command recorder 14 is configured to provide specified path information about the recordings for user selection, namely the SCPI recordings.

In some embodiments, the measurement system 10 comprises a toolkit, namely the common processing module 20 encompassing the conversion module 16 as well as the code generation module 18. The toolkit may relate to a software module that simplifies generation of a remote script, a user application or rather a certain program. In some embodiments, the measurement system 10 allows to automatically creating the standalone executable code.

In some embodiments, the measurement system 10 is generally configured to directly convert the manual measurement device configuration into the standalone executable code, namely the program that may run on the measurement device 12 itself or the other processing unit 24.

Additionally or alternatively, the standalone executable code may be installed automatically wherein all necessary libraries on the target platform are included during the automatic installation.

In some embodiments, a recorded remote control sequence obtained while setting the intended measurement setup may be downloaded from the measurement device 12, as the respective commands are recorded by the command recorder 14 that is assigned to the measurement device 12.

Additional instructions provided by the user may also be taken into account when generating the standalone executable code such that a user may manually program certain aspects of the overall standalone executable code. However, this programming interface is only optional in order to allow a user of the measurement system 10 to actively adapt the standalone executable code with regard to his personal preferences or rather needs.

The instructions and (optionally) the additional instructions are compiled in an appropriate manner. Further, the particular dynamic link libraries (DLL) and other libraries are added in some embodiments that relate to or correspond to the specific programming language that is used by the operating system of the measurement device 12.

For instance, style elements such as buttons and/or control members displayed, may be added or rather loaded with the respective library.

In summary, in embodiments of the present disclosure, it is not necessary for the user of the measurement system 10 to have programming skills in order to control the measurement device 12 in a remote manner, as the respective programming is done in an automatic manner based on the manual setup of the measurement device 12.

In some embodiments, the configuration or rather the setting of the measurement device 12 is recorded by the at least one command recorder 14 assigned to the measurement device 12, for example the integrated command recorder 14.

The respective commands recorded are converted/translated into specific instructions that are further processed by the toolkit, namely the common processing module 20 encompassing the conversion module 16 and the code generation module 18. The toolkit may relate to a software module that runs additionally to the (integrated) command recorder 14.

In general, the remote control does not have to take place from a separate device, for instance a personal computer. Put another way, the measurement instrument or rather the measurement device 12 itself may comprise the command recorder. Thus, the measurement device 12 may also act as the controller of itself.

Accordingly, the measurement system 10 may relate to a single device with a housing that encompasses all components of the measurement system 10.

Generally, the at least one remote control command relates to a control command issued on a device separately formed with respect to the measurement device 12 and/or a control command issued at the measurement device 12 itself, for instance while manually setting the intended measurement setup.

It will be understood that one or more of the components, such as the measurement device 12, command recorder 14, conversion module 16, code generation module 18, common processing module 20, user interface 22, other processing unit 24, and/or other user interface 26 etc., described above may include, in some embodiments, logic for implementing the technologies and methodologies described herein. This logic of one or more of these components can be carried out in either hardware or software, or a combination of hardware and software.

In an example, the functionality of one or more of these components could be implemented by special purpose hardware-based computer systems or circuits, etc., or combinations of special purpose hardware and computer instructions. In some embodiments, one or more of these components includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, one or more of these components include a microprocessor and a memory storing logic modules and/or instructions. In an embodiment, one or more of these components include one or more ASICs having a plurality of predefined logic components. In an embodiment, the one or more modules include one or more FPGA having a plurality of programmable logic components. In an embodiment, one or more of these components includes combinations of circuits and computer program products having software or firmware instructions stored on one or more computer readable memories that work together to cause a device to perform one or more methodologies or technologies described herein. In an embodiment, one or more of these components includes hardware circuits (e.g., implementations in analog circuitry, implementations in digital circuitry, and the like, and combinations thereof) for carrying out the functionality described herein.

It will be appreciated that one or more aspects of the methods set forth herein can be carried out, for example, in a computer-like system. In this regard, one or more program elements are provided, which are configured and arranged when executed on a computer or computing device, to customized setting at least one measurement device. In one embodiment, the one or more program elements may specifically be configured to perform one or more of the following steps: setting an intended measurement setup on the at least one measurement device manually via a user interface; recording, via a command recorder, at least one remote control command assigned to the manual setting of the intended measurement setup; converting the at least one remote control command recorded into specific instructions; and generating a standalone executable code at least based on the specific instructions obtained from the remote control command recorded. In other embodiments, the one or more program elements may specifically be configured to perform one or more of the steps of claims 2-15.

The one or more program elements may be installed in memory, such as computer readable storage medium. The computer readable storage medium may be or included by any one of the computing devices, engines, modules, instruments, analyzers, displays, units, etc., described elsewhere herein or another and separate computing device, engines, modules, instruments, analyzers, displays, units, etc., as may be desirable. The computer readable storage medium and the one or more program elements, which may comprise computer-readable program code portions embodied therein, may further be contained within a non-transitory computer program product.

As mentioned, various embodiments of the present disclosure may be implemented in various ways, including as non-transitory computer program products, computer readable instructions, etc. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, optical disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. Other non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM) of any rate, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

The computer-readable media include cooperating or interconnected computer-readable media, which exist exclusively on a processing system or distributed among multiple interconnected processing systems that may be local to, or remote from, the processing system.

As should be appreciated, various embodiments of the present disclosure may be also implemented as methods, apparatus, systems, computing devices, computing entities, computing engines or modules, and/or the like, as have been described elsewhere herein or claimed below. As such, embodiments of the present disclosure may take the form of an apparatus, system, computing device, computing entity, computing engines or modules and/or the like executing instructions stored on a computer-readable storage medium to perform certain steps or operations. However, embodiments of the present disclosure may also take the form of an entirely hardware embodiment performing certain steps or operations.

Various embodiments are described above with reference to block diagrams and/or flowchart illustrations of apparatuses, methods, systems, and computer program products. It should be understood that each block of any of the block diagrams and/or flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks and/or carry out the methods described herein.

These computer program instructions may also be stored in a computer-readable memory, such as the computer-readable storage media described above, that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, could be implemented by special purpose hardware-based computer systems or circuits, etc., that perform the specified functions or operations, or combinations of special purpose hardware and computer instructions.

According to some embodiments, many individual steps of a process may or may not be carried out utilizing the computer systems described herein, may be carried out in a different order including both serially and in parallel, and the degree of computer implementation may vary, as may be desirable and/or beneficial for one or more particular applications.

In some embodiments, one or more computer-readable storage media is provided containing computer readable instructions embodied thereon that, when executed by one or more computing devices (contained in or associated with the one or more components set forth above), cause the one or more computing devices to perform one or more steps of the methods described herein, such as one or more actions described in association with the blocks of FIG. 3. In other embodiments, one or more of these method steps can be implemented in digital and/or analog circuitry or the like.

It should now be appreciated that some embodiments of the present disclosure, or portions thereof, have been described in the general context of computer code or machine-useable instructions, including computer-executable instructions such as program modules, etc., being executed by a computing system, or other machine or machines. Some of these embodiments or others may be implemented using a variety of system configurations, including handheld devices, consumer electronics, general-purpose computers, more specialty computing devices, etc. Embodiments described herein may also be implemented in distributed computing environments, using remote-processing devices that are linked through a communications network or the Internet.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of customized setting at least one measurement device, comprising:
  setting an intended measurement setup on the at least one measurement device manually via a user interface that relates to a graphical user interface via which a user may interact with the measurement device, wherein the intended measurement setup relates to settings of the measurement device, which are applied in order to put the measurement device into condition for performing respective measurements;

recording, via a command recorder, at least one remote control command assigned to the manual setting of the intended measurement setup set manually via the graphical user interface such that the setting of the measurement device is recorded by the command recorder assigned to the measurement device;

converting the at least one remote control command recorded into specific instructions, wherein the at least one remote control command recorded is assigned to the manual setting of the intended measurement setup of the measurement device, which was set manually via the graphical user interface; and generating a standalone executable code at least based on the specific instructions obtained from the remote control command recorded by compiling the instructions and adding dynamic link libraries (DLL) and other libraries based on a specific programming language used by an operating system of the measurement device such that the manual setting made via the graphical user interface of the measurement device is transferred into the standalone executable code, thereby creating a user-defined executable code which extends a functionality of the measurement device with regard to measurements to be performed by the measurement device.

2. The method according to claim 1, wherein the standalone executable code is generated automatically.

3. The method according to claim 1, wherein the manual setting of the intended measurement setup is converted automatically into the standalone executable code.

4. The method according to claim 1, wherein the specific instructions are integrated into an already existing code when generating the standalone executable code.

5. The method according to claim 1, wherein the at least one remote control command is a standard command for programmable instruments (SCPI) command.

6. The method according to claim 1, wherein the at least one remote control command recorded is read out from the command recorder, and wherein an automatic framing is applied on the at least one remote control command recorded in order to obtain the specific instructions.

7. The method according to claim 1, wherein additional instructions are taken into account that are provided by the user.

8. The method according to claim 1, wherein other code selected or created by the user is taken into account.

9. The method according to claim 1, wherein the standalone executable code is loaded into the at least one measurement device.

10. The method according to claim 1, wherein the standalone executable code is executed on at least one of a separate processing unit assigned to the at least one measurement device or the at least one measurement device itself.

11. The method according to claim 1, wherein the at least one measurement device is a remotely controlled measurement device.

12. The method according to claim 1, wherein the user has at least one of remote access and physical access to the at least one measurement device via the user interface.

13. The method according to claim 1, wherein the command recorder is a remote command recorder that is queried by entering an assigned IP address.

14. The method according to claim 13, wherein the remote command recorder provides specified path information about standard commands for programmable instruments (SCPI) recordings for user selection.

15. The method according to claim 1, wherein the standalone executable code is provided to the user via the user interface, via which the user is enabled to directly execute the standalone executable code.

16. A measurement device for performing customized measurements, the measurement device comprising:
a user interface via which a user of the measurement device is enabled to manually set an intended measurement setup of the at least one measurement device, wherein the user interface relates to a graphical user interface via which the user may interact with the measurement device, wherein the intended measurement setup relates to settings of the measurement device, which are applied in order to put the measurement device into condition for performing respective measurements, wherein the graphical user interface is integrated with the measurement device;
at least one command recorder integrated in the at least one measurement device, the command recorder being configured to record at least one remote control command assigned to the manual setting of the intended measurement setup;
a conversion module configured to convert the at least one remote control command into specific instructions; and
a code generation module configured to generate a standalone executable code at least based on the specific instructions obtained,
wherein the conversion module and the code generation module are loaded or installed on the measurement device such that a computer is not required in order to generate and execute the standalone executable code.

17. The measurement device according to claim 16, wherein the conversion module is configured to read out from the command recorder the at least one remote control command recorded.

18. The measurement device according to claim 16, wherein the conversion module is configured to apply a framing on the at least one remote command recorded.

19. The measurement device according to claim 16, wherein at least one of the conversion module and the code generation module corresponds to a software module.

* * * * *